US006677253B2

(12) United States Patent
Andideh et al.

(10) Patent No.: US 6,677,253 B2
(45) Date of Patent: Jan. 13, 2004

(54) CARBON DOPED OXIDE DEPOSITION

(75) Inventors: Ebrahim Andideh, Portland, OR (US); Kevin L. Peterson, Hillsboro, OR (US); Jeffery D. Bielefeld, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 09/972,228

(22) Filed: Oct. 5, 2001

(65) Prior Publication Data

US 2003/0077921 A1 Apr. 24, 2003

(51) Int. Cl.[7] .................. H01L 21/31; H01L 21/469
(52) U.S. Cl. ..................... 438/784; 438/783
(58) Field of Search ................... 438/681, 680, 438/783, 784, 787, 789, 790

(56) References Cited

U.S. PATENT DOCUMENTS

| | | | |
|---|---|---|---|
| 5,872,401 A | 2/1999 | Huff et al. | |
| 6,068,884 A | 5/2000 | Rose et al. | |
| 6,077,764 A | 6/2000 | Sugiarto et al. | |
| 6,147,009 A | 11/2000 | Grill et al. | |
| 6,159,845 A | 12/2000 | Yew et al. | |
| 6,211,096 B1 | 4/2001 | Allman et al. | |
| 6,251,770 B1 | 6/2001 | Uglow et al. | |
| 6,258,735 B1 | 7/2001 | Xia et al. | |
| 6,331,494 B1 | 12/2001 | Olson et al. | |
| 6,350,670 B1 | 2/2002 | Andideh et al. | |
| 6,362,091 B1 | 3/2002 | Andideh et al. | |
| 6,407,013 B1 * | 6/2002 | Li et al. | 438/788 |
| 6,410,462 B1 * | 6/2002 | Yang et al. | 438/624 |
| 6,423,630 B1 * | 7/2002 | Catabay et al. | 427/249.15 |
| 6,436,822 B1 * | 8/2002 | Towle | 438/681 |
| 6,440,876 B1 * | 8/2002 | Wang et al. | 438/778 |
| 6,441,491 B1 * | 8/2002 | Grill et al. | 257/759 |
| 6,482,754 B1 | 11/2002 | Andideh et al. | |
| 2001/0010970 A1 * | 8/2001 | Uglow et al. | 438/622 |
| 2002/0093075 A1 | 7/2002 | Gates et al. | |
| 2003/0042605 A1 | 3/2003 | Andideh et al. | |

FOREIGN PATENT DOCUMENTS

| | | |
|---|---|---|
| EP | 1 077 477 A1 | 2/2001 |
| EP | 1 148 539 A2 | 10/2001 |
| EP | 1 195 451 A1 | 4/2002 |
| EP | 1 201 785 A1 | 5/2002 |
| WO | WO 99/38202 | 7/1999 |

OTHER PUBLICATIONS

Search Report for PCT/US 02/31525 mailed Jan. 22, 2003, 5 pages.

Weber, et al, D., "Impact of substituting SiO ILD by low k materials into AlCu Rie metallization", Infineon Technologies AG, Konigsbruckerstrafe 180, D–01099 Dresden Germany, Current Address : Infineon Technologies, Inc. IBM Semiconductor Research and Development Center, Hopewell Junction, NY 12533, USA.

\* cited by examiner

*Primary Examiner*—Richard Elms
*Assistant Examiner*—Beth E. Owens
(74) *Attorney, Agent, or Firm*—Blakely, Sokoloff, Taylor & Zafman LLP

(57) ABSTRACT

A method for carbon doped oxide (CDO) deposition is described. One method of deposition includes providing a substrate and introducing oxygen to a carbon doped oxide precursor in the presence of the substrate. A carbon doped oxide film is formed on the substrate. In another method the substrate is placed on a susceptor of a chemical vapor deposition apparatus. A background gas is introduced along with the carbon doped oxide precursor and oxygen to form the carbon doped oxide film on the substrate.

16 Claims, 4 Drawing Sheets

CARBON DOPED OXIDE DEPOSITION

BACKGROUND

The present invention relates to semiconductor layer deposition. In particular, the present invention relates to carbon doped oxide deposition.

BACKGROUND OF THE RELATED ART

In the fabrication of semiconductor devices, layers of varying purposes are formed on a semiconductor substrate. One such layer, an inter-layer dielectric ILD), is deposited and patterned to isolate and support capacitor features such as parallel conductive metal lines. As semiconductor devices and device features decrease in size, the distance between such conductive lines 275, as shown in FIG. 2C, correspondingly decreases. All other factors remaining constant, this results in a higher capacitance (C). For example, given the parallel conductive lines 275 described, capacitance (C) can be viewed as $$\frac{k\varepsilon A}{d}$$

where (d) is the distance between the conductive lines 275, (A), the area of each conductive line interface, ($\varepsilon$), the permeability of the ILD, and (k), the dielectric constant (a factor of how much effect the ILD material has on capacitor value).

It can be seen from the above equation that, all other factors remaining constant, as the distance (d) decreases, the capacitance (C) of the system increases. Unfortunately, as capacitance (C) increases so does signal transmission time. Other problems, such as power dissipation and increased cross-talk can also occur. Therefore, reduced capacitance (C) is sought.

The dielectric constant (k) noted above has no units of measure. For example, where the dielectric is of a vacuum or air, the dielectric constant (k) is about equal to 1, having no effect on capacitance. However, most intra-layer dielectric materials have a degree of polarity with a dielectric constant (k) above 1. For example, silicon dioxide, a common ILD material, has a dielectric constant generally exceeding about 4. Due to the decreasing size of semiconductor features (e.g., reduced distance (d) leading to increased capacitance (C)), efforts have recently been made to reduce the dielectric constant (k) of the ILD as a means by which to reduce capacitance (C). That is, where capacitance (C) is $$\frac{k\varepsilon A}{d}$$

and all other factors remaining constant, reduction of the dielectric constant (k) can reduce capacitance (C).

Low dielectric constant (k) materials (i.e. 'low k' materials), such as fluorinated silica glass (FSG), SiLK™, and carbon doped oxides (CDO's) have been used to form the ILD, thereby reducing capacitance (C). However, the deposition of 'low k' materials includes a problem of low deposition rate leading to increased semiconductor processing times, also referred to as low thurput.

DETAILED DESCRIPTION

Methods of deposition of CDO features are described. Aspects of embodiments are described and illustrated by the accompanying drawings. While the following embodiments are described with reference to deposition of particular carbon doped oxide films to form ILD's, the embodiments are applicable to the formation of any carbon doped oxide feature. This can include carbon doped oxide films formed from precursors having formulas such as $H_xSi(CH_3)_{4-x}$, and $(CH_3)_xSi(OCH_3)_{4-x}$, or tetramethylcyclotetrasiloxane, among others.

Embodiments described below are generally applicable to processing of a semiconductor substrate. Once a substrate has been obtained, initial processing can include the formation of a dielectric layer above a surface of the substrate. Embodiments described here focus on the deposition of CDO dielectric material, in particular, by introduction of oxygen in the presence of a CDO precursor to increase the rate of CDO deposition.

Figure 1:
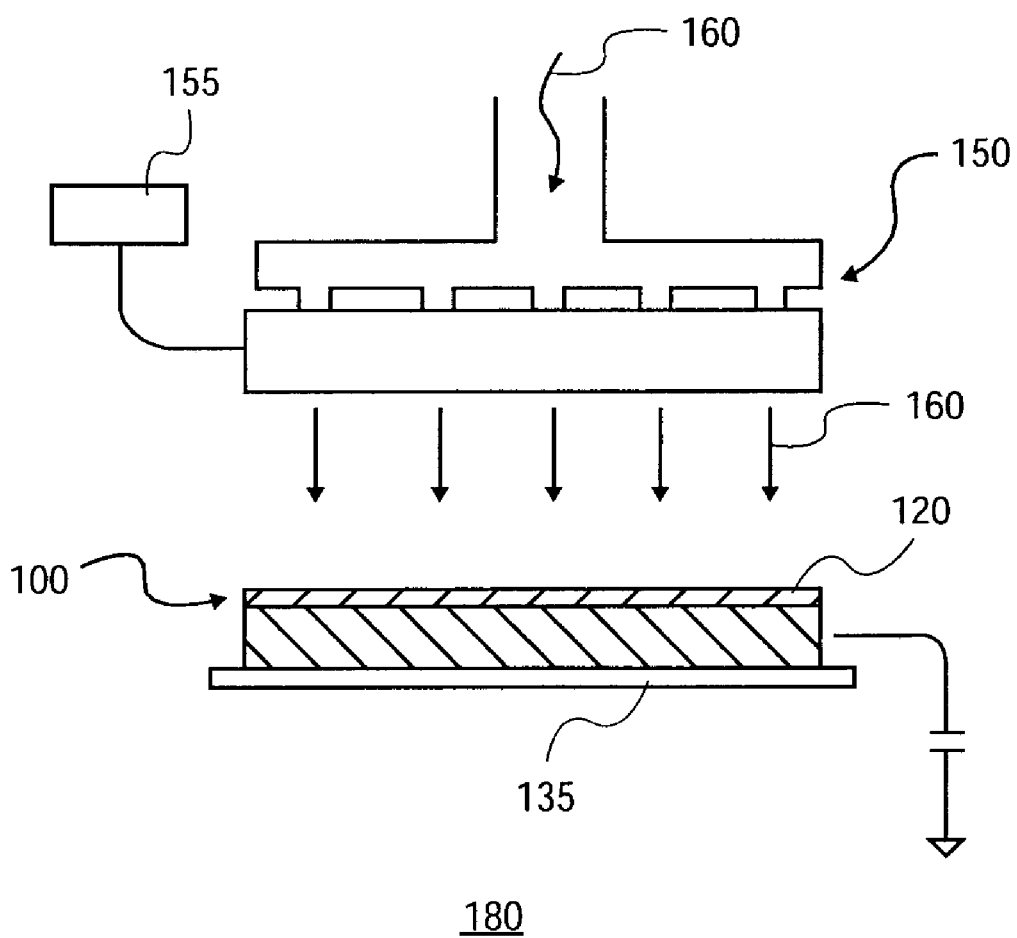
FIG. 1 is a side cross-sectional view of an embodiment of a semiconductor substrate in a reactor.

Referring to FIG. 1, an embodiment is shown of a substrate 100 that is exposed to a gas mixture 160 that includes a CDO precursor. Oxygen is also included in the gas mixture 160 to increase the rate of CDO deposition on the substrate 100 when, for example, the gas mixture 160 is excited to cause deposition as described further herein.

The substrate 100 includes an initial dielectric etch-stop layer 120. The substrate 100 can be of silicon and other conventional materials. The etch-stop layer 120 is not required but is shown for illustration as described further herein. Additionally, in other embodiments of the invention various other insulating or conducting layers and features may be present on the substrate 100 that are not necessarily described here.

The substrate 100 is placed within a reactor 180 for deposition of a material on the substrate 100. In the embodiment shown, the material to be formed on the substrate 100 is a Carbon Doped Oxide (CDO) to act as an ILD. A CDO material is a material that has incorporated silicon (Si), carbon (C), and oxygen (O), providing relatively reduced polarity, density, and conductivity. For example, CDO material can have a dielectric constant (k) that is less than about 3.0. Therefore, CDO materials are generally considered 'low k' materials, and useful for lowering capacitance when used as ILD's as discussed further herein.

In one embodiment, the reactor 180 is a conventional chemical vapor deposition (CVD) apparatus. The CVD apparatus may be plasma enhanced (i.e. a PECVD apparatus) and operated by conventional means. In the embodiment shown, the PECVD apparatus is provided with a shower plate 150 coupled to a power source 155. The substrate 100 is grounded and positioned adjacent the shower plate 150. In the embodiment shown, the substrate 100 is positioned between about 15 mm and about 40 mm from the shower plate 150, preferably between about 24 mm and about 26 mm.

Once the substrate 100 is positioned and the PECVD apparatus sealed, the gas mixture 160 is introduced into the apparatus in vapor form. Simultaneously, radio frequency (RF) is applied through the PECVD apparatus such that the gas mixture 160 is excited to a plasma state to cause deposition on the surface of the substrate 100. In alternate embodiments, at least a portion of the gas mixture 160 is excited to a plasma state at a remote location prior to introduction to the PECVD apparatus. In such an embodiment, this portion of the gas mixture 160 can enter the PECVD apparatus already in a plasma state.

The gas mixture 160 referenced above includes a CDO precursor and a deposition enhancing gas such as oxygen. As discussed further herein, the inclusion of oxygen increases the rate of deposition and formation of the CDO material. An inert gas such as helium (He) can also be provided as part of the gas mixture 160 to serve as a volume-filler within the PECVD apparatus during deposition. The inert gas can also be a good heat conductor to promote thermal uniformity. However, it does not actually take part, chemically, in the deposition process. In addition to helium (He), other inert gasses, such as argon (Ar), neon (Ne), krypton (Kr), and xenon (Xe) can be used as a background gas.

A CDO precursor, which is a part of the gas mixture 160 described above, supplies a source of carbon (C) and silicon (Si) for the formation of CDO features. A CDO precursor can also supply a source of oxygen (O). However, this is not required, as oxygen (O) is separately provided according to embodiments described herein. Embodiments of CDO precursors include tetramethylcyclotetrasiloxane ($(HSiOCH_3)_4$) and gasses having a formula of $H_xSi(CH_3)_{4-x}$, or $(CH_3)_xSi(OCH_3)_{4-x}$. For example, in one embodiment dimethyldimethoxysilane $(CH_3)_2Si(OCH_3)_2$ is used as the CDO precursor. Such CDO precursors result in a CDO material with a dielectric constant (k) that is less than about 3.0 as described above.

In the embodiment described above, oxygen gas is supplied to the PECVD apparatus and excited (e.g. $O^*$) by application of RF. The oxygen gas supplied as part of the gas mixture 160 can initially be in the form of ionic oxygen (e.g. $O^{2-}$), molecularly stable oxygen ($O_2$), elementally stable oxygen (O), or ozone ($O_3$). Regardless, RF is applied affecting the oxygen gas as it enters the PECVD apparatus such that at least a portion of the oxygen molecules will be in an excited state (e.g. $O^*$). The excited oxygen molecules interact with the CDO precursor to increase the rate of CDO deposition. In another embodiment, oxygen, in the form of ozone ($O_3$) is excited thermally without use of RF to increase the rate of CDO deposition. The ozone ($O_3$) form of the oxygen gas is more readily excitable in this manner.

In another alternate embodiment, the oxygen gas is excited, along with the background gas, at a remote location separate from the CDO precursor of the gas mixture 160. In this embodiment, the CDO precursor is excited upon introduction to the PECVD apparatus, where it combines with the already excited oxygen gas.

As described above, the gas mixture 160 enters the PECVD apparatus, which is energized by introduction of RF. The process can proceed within the PECVD apparatus at conventional pressures, temperatures, radio frequency (RF) and power. For example, in one embodiment pressure is maintained between about 2.0 Torr and about 10.0 Torr, preferably between about 3.0 Torr and about 6.0 Torr, temperature of the susceptor 135 supporting the substrate 100 is maintained between about 250° C. and about 450° C., and RF is maintained at standard frequencies and between about 1,600 watts and about 1,800 watts are supplied.

With respect to the embodiments described above, the oxygen gas is in an amount that is less than about 5% of the volume taken up by the oxygen and CDO precursor. Additionally, flow rates, in standard cubic centimeters per minute (sscm), for the individual gasses of the gas mixture 160 can be as follows:

| | |
|---|---|
| Precursor gas flow rate | 50–200 Sccm |
| Background gas flow rate | 20–200 Sccm |
| Oxygen gas flow rate | 1.0–20 Sccm |

Flow rates such as those above can be established depending on a variety of factors, such as temperature and pressure conditions. In fact, flow rates other than those described above can be used without departing from the spirit and scope of the present invention.

The addition of oxygen to the gas mixture 160 in a manner such as that described above leads to a deposition rate of CDO onto the substrate 100 that can exceed about 5,620 angstroms per minute. In one embodiment, CDO deposition rate is between about 5,620 angstroms per minute and about 9,600 angstroms per minute, preferably up to about 9,580 angstroms per minute. This can translate into about a 70% increase in CDO deposition rate as compared to conventional PECVD deposition of CDO without the introduction of oxygen.

Figure 2A:
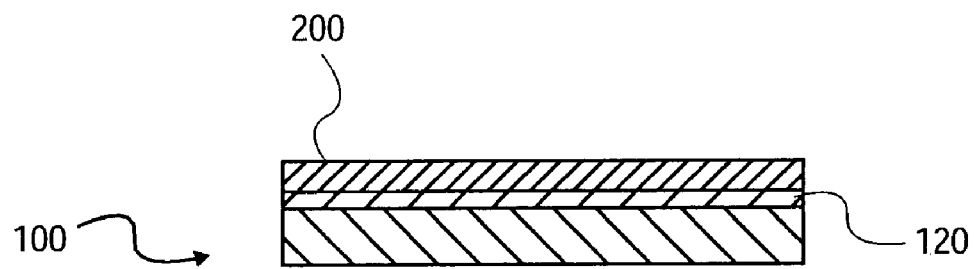
FIG. 2A is a side cross-sectional view of the substrate of FIG. 1 following deposition of a CDO film.

Referring to FIG. 2A, the substrate 100 of the embodiment of FIG. 1 is shown with a CDO film 200 deposited above an etch-stop layer 120. The CDO film 200 has a dielectric constant that is less than about 3.0. In one embodiment the CDO film dielectric constant is less than about 2.7. Additionally, deposition of the CDO film 200 in the presence of oxygen may provide a slightly lower dielectric constant, when compared to the deposition of the same CDO film 200 in the absence of oxygen. In the embodiment shown the CDO film 200 is to form a CDO ILD (see FIG. 3). However this is not required. The CDO film 200 can be used for a variety of insulating purposes.

Figure 2B:
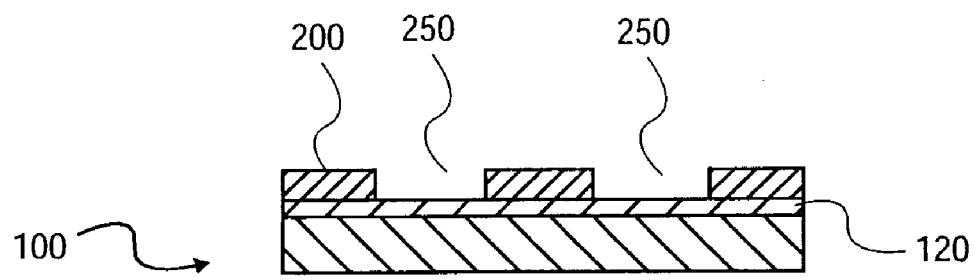
FIG. 2B is a side cross-sectional view of the substrate of FIG. 2A following trench etch.

Referring to FIG. 2B, the CDO film 200 is etched to form trenches 250. In the embodiment shown, the CDO film 200 is patterned and etched by conventional means. For example, a protective mask pattern can be placed above the CDO film 200 exposing areas to form the parallel trenches 250. A chemical etchant is then applied to etch through exposed portions of the CDO film 200. The etch-stop layer 120 is of a material resistant to chemical etchant and helps control the depth of the etched trenches 250. The etch-stop layer 120 can be of silicon nitride (SiN), silicon carbide (SiC), or other conventional etch-stop material.

Figure 2C:
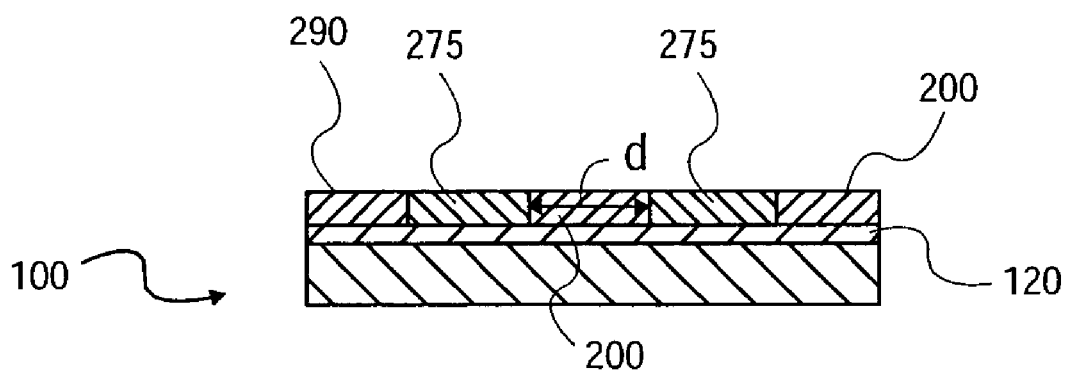
FIG. 2C is a side cross-sectional view of the substrate of FIG. 2B following formation of conductive metal lines.

Referring to FIG. 2C, the deposited CDO film 200 provides structural support and isolation of conductive lines 275 in the form of a CDO ILD. In the embodiment shown, the conductive lines 275 are deposited upon etch of the CDO film 200 to form a CDO ILD down to the etch-stop layer 120. In one embodiment, the conductive lines 275 are of copper (Cu). Additionally, in one embodiment the etch-stop layer 120 also acts as a barrier to prevent diffusion of copper ions ($Cu^+$) to below the etch-stop layer 120, therefore maintaining a degree of isolation of the conductive lines 275.

The conductive lines 275 can be deposited by conventional means. For example, in one embodiment, an ionized form of conductive line material (e.g. $Cu^+$) can be supplied in vapor form to a conventional PECVD apparatus. RF can be applied to the apparatus to generate a plasma and effect deposition of a conductive layer including the conductive lines 275. Other excess of the conductive layer can be removed by conventional Chemical-Mechanical Polishing (CMP) techniques such that the substrate 100 includes a smooth upper surface 290 and further isolating the conductive lines 275 as shown in FIG. 2C.

The deposited conductive lines 275 are separated by a distance (d) wherein ILD material 200 is present isolating the conductive lines 275. As described earlier, where capacitance (C) is $$\frac{k\varepsilon A}{d},$$

reduction in the distance (d) can increase capacitance (C). However, embodiments described here include the use of 'low k' CDO ILD material 200 to compensate for this problem in a manner that does not sacrifice reasonable thruput (e.g. semiconductor processing time) due to lengthy CDO deposition times.

Figure 3:
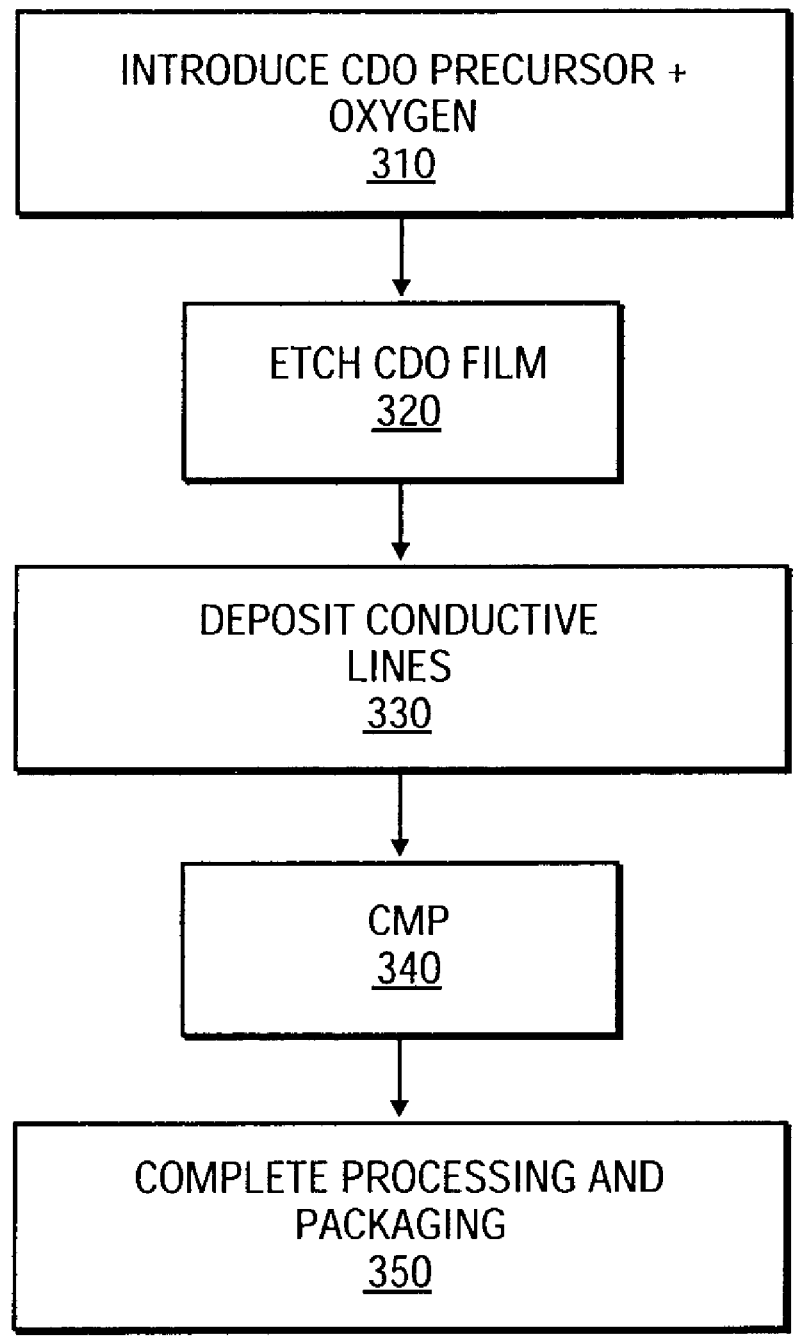
FIG. 3 is a flowchart summarizing an embodiment of semiconductor substrate processing.

Referring to FIG. 3, a summary of a preferred embodiment of CDO deposition according to the methods described above is shown in the form of a flowchart. In embodiments described here, a substrate is placed in a reactor where a CDO precursor and oxygen are introduced 310. Deposition results to form a CDO film on the substrate. The deposition takes place in an otherwise conventional manner, such as within a PECVD apparatus operated under conventional conditions. Deposition in this manner takes place at an increased rate due to the presence of oxygen. The CDO film is then etched 320. Etching 320 of the CDO is achieved by conventional methods, with conventional etchants applied to the CDO film. Once etching 320 is complete, conductive lines 275 are deposited 330, again by conventional means such as within a PECVD apparatus operated under conventional conditions. CMP 340 is then applied and the substrate is available for completion of further processing and packaging 350.

Embodiments described above include CDO deposition in the presence of oxygen. Additionally, embodiments include reference to particular 'low k' materials deposited to form ILD's. Although exemplary embodiments describe particular CDO materials deposited to form ILD's, additional embodiments are possible. For example, CDO films can be formed at an increased rate according to embodiments discussed above for insulating purposes apart from ILD formation. Furthermore, many changes, modifications, and substitutions may be made without departing from the spirit and scope of these embodiments.

We claim:
1. A method comprising:
providing a substrate; and
introducing oxygen to a carbon doped oxide precursor in the presence of said substrate for deposition of a carbon doped oxide film on said substrate, wherein said oxygen is less than about 5% of a volume taken up by said oxygen and said carbon doped oxide precursor.
2. The method of claim 1, wherein said carbon doped oxide precursor is selected from a group consisting of tetramethylcyclotetrasiloxane, a precursor having a formula of $H_x$ Si $(CH_3)_{4-x}$, and a precursor having a formula of $(CH_3)_x$ Si $(OCH_3)_{4-x}$.
3. The method of claim 1, wherein said oxygen is selected from a group consisting of ionic oxygen, molecularly stable oxygen, elementally stable oxygen, and ozone.
4. The method of claim 1, wherein said introducing comprises adding an inert background gas in the presence of said substrate to provide a volume filler for said deposition of said carbon doped oxide film.
5. The method of claim 1, wherein said introducing is via a chemical vapor deposition apparatus.
6. The method of claim 1, wherein said carbon doped oxide film has a dielectric constant of less than about 3.0.
7. The method of claim 1, wherein said deposition of said carbon doped oxide film occurs at a rate exceeding about 5,620 angstroms per minute.
8. The method of claim 1, further comprising etching said carbon doped oxide film for deposition of conductive lines, said carbon doped oxide film to act as an inter-layer dielectric between said conductive lines.
9. A method of forming a carbon doped oxide film on a substrate, said method comprising:
placing said substrate on a susceptor of a chemical vapor deposition apparatus;
introducing a background gas, a carbon doped oxide precursor and an oxygen into said apparatus, wherein said oxygen is less than about 5% of a volume taken up by said oxygen and said carbon doped oxide precursor; and
operating said apparatus at conditions to cause said carbon doped oxide film to form on said substrate.
10. The method of claim 9, wherein said carbon doped oxide precursor is selected from a group consisting of tetramethylcyclotetrasiloxane, a precursor having a formula of $H_x$ Si $(CH_3)_{4-x}$, and a precursor having a formula of $(CH_3)_x$ Si $(OCH_3)_{4-x}$.
11. The method of claim 9, wherein said conditions include a temperature of between about 250° C. and about 450° C. of said susceptor.
12. The method of claim 9, wherein said conditions include a pressure within said apparatus of between about 2 Torr and about 10 Torr.
13. The method of claim 9, wherein said background gas is inert helium.
14. The method of claim 9, wherein said introducing includes a flow rate of between about 50 sccm and about 200 sccm of said carbon doped oxide precursor, a flow rate of between about 20 sccm and about 200 sccm of said background gas, and a flow rate of between about 1.0 sccm and about 20 sccm of said oxygen.
15. The method of claim 9, wherein said chemical vapor deposition apparatus is a plasma enhanced chemical vapor deposition apparatus.
16. The method of claim 9, wherein said carbon doped oxide film is dimethyldimethoxysilane.

* * * * *

UNITED STATES PATENT AND TRADEMARK OFFICE
CERTIFICATE OF CORRECTION

PATENT NO. : 6,677,253 B2
DATED : January 13, 2004
INVENTOR(S) : Andideh et al.

It is certified that error appears in the above-identified patent and that said Letters Patent is hereby corrected as shown below:

<u>Column 1,</u>
Line 13, delete "ILD)" and insert -- (ILD) --.
Line 63, delete "thurput" and insert -- thruput --.

<u>Column 4,</u>
Lines 7-10, delete "Sccm" and insert -- sccm --.

Signed and Sealed this

Eighth Day of June, 2004

JON W. DUDAS
*Acting Director of the United States Patent and Trademark Office*